US009641143B2

(12) United States Patent
Chabert

(10) Patent No.: US 9,641,143 B2
(45) Date of Patent: May 2, 2017

(54) ELECTRONIC DEVICE FOR A RADIOFREQUENCY SIGNAL RECEPTION CHAIN, COMPRISING A LOW-NOISE TRANSIMPEDANCE AMPLIFIER STAGE

(71) Applicant: STMicroelectronics SA, Montrouge (FR)

(72) Inventor: Laurent Chabert, Saint Martin D'heres (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/192,151

(22) Filed: Jun. 24, 2016

(65) Prior Publication Data
US 2016/0308501 A1 Oct. 20, 2016

Related U.S. Application Data

(63) Continuation of application No. 14/734,514, filed on Jun. 9, 2015, now Pat. No. 9,413,307.

(30) Foreign Application Priority Data

Sep. 19, 2014 (FR) ...................................... 14 58865

(51) Int. Cl.
*H03F 3/45* (2006.01)
*H04B 1/06* (2006.01)
(Continued)

(52) U.S. Cl.
CPC ............ *H03F 3/45282* (2013.01); *G01S 7/03* (2013.01); *H03D 7/1433* (2013.01); *H03D 7/1458* (2013.01); *H03F 1/0205* (2013.01); *H03F 1/0261* (2013.01); *H03F 3/19* (2013.01); *H03F 3/193* (2013.01); *H03F 3/3028* (2013.01); *H03F 3/45076* (2013.01); *H03F 3/45372* (2013.01);
(Continued)

(58) Field of Classification Search
USPC ........................................ 330/258, 260, 255
IPC ....................................................... H03F 3/45
See application file for complete search history.

(56) References Cited

U.S. PATENT DOCUMENTS 4,388,699 A * 6/1983 Balakrishnan ..... G11C 19/0866
365/8
5,642,078 A 6/1997 Navabi et al.
(Continued)

FOREIGN PATENT DOCUMENTS

EP 1668775 A1 6/2006

OTHER PUBLICATIONS

Search Report and Written Opinion for co-pending DE application No. 102015115225.8 dated Jun. 16, 2016 (10 pages).
(Continued)

*Primary Examiner* — Patricia T Nguyen
(74) *Attorney, Agent, or Firm* — Gardere Wynne Sewell LLP

(57) ABSTRACT

An electronic device includes a transimpedance amplifier stage having an amplifier end stage of the class AB type and a preamplifier stage coupled between an output of a frequency transposition stage and an input of the amplifier end stage. A self-biased common-mode control stage is configured to bias the preamplifier stage. The preamplifier stage is formed by a differential amplifier with an active load that is biased in response to the self-biased common-mode control stage.

20 Claims, 2 Drawing Sheets

(51) Int. Cl.
    *H03F 1/02*         (2006.01)
    *H03F 3/19*         (2006.01)
    *H03F 3/193*        (2006.01)
    *H03F 3/30*         (2006.01)
    *H03D 7/14*         (2006.01)
    *G01S 7/03*         (2006.01)

(52) U.S. Cl.
    CPC ......... *H04B 1/06* (2013.01); *H03F 2200/294* (2013.01); *H03F 2200/336* (2013.01); *H03F 2200/451* (2013.01); *H03F 2200/91* (2013.01); *H03F 2203/30015* (2013.01); *H03F 2203/45081* (2013.01); *H03F 2203/45112* (2013.01); *H03F 2203/45154* (2013.01); *H03F 2203/45288* (2013.01)

(56) References Cited

U.S. PATENT DOCUMENTS

| | | |
|---|---|---|
| 6,486,739 B1 | 11/2002 | Luo |
| 7,088,181 B1* | 8/2006 | Voo .................... H03F 3/45188 330/258 |
| 7,746,172 B1* | 6/2010 | Kobayashi ............. H03F 1/083 330/260 |
| 2002/0101285 A1* | 8/2002 | Chatwin ............... H03F 3/4508 330/254 |
| 2003/0151458 A1* | 8/2003 | Smith ................... H03F 3/3432 330/98 |
| 2003/0155959 A1 | 8/2003 | Belot et al. |
| 2004/0176064 A1 | 9/2004 | Mattisson |
| 2005/0174175 A1 | 8/2005 | Heigelmayer et al. |
| 2007/0069816 A1 | 3/2007 | Behzad |
| 2007/0186668 A1 | 8/2007 | Garverick et al. |
| 2008/0116975 A1 | 5/2008 | Malone |
| 2009/0088110 A1 | 4/2009 | Schuur et al. |
| 2010/0039174 A1 | 2/2010 | Teetzel |
| 2010/0148036 A1 | 6/2010 | Suzuki et al. |
| 2010/0231452 A1 | 9/2010 | Babakhani et al. |
| 2010/0279641 A1 | 11/2010 | Lu et al. |
| 2011/0304393 A1 | 12/2011 | Luff |
| 2012/0161844 A1 | 6/2012 | Chee et al. |
| 2013/0294784 A1 | 11/2013 | Suzuki |
| 2014/0206296 A1 | 7/2014 | Chakraborty et al. |

OTHER PUBLICATIONS

INPI Search Report and Written Opinion for FR 1458865 dated May 20, 2015 (8 pages).

\* cited by examiner

ELECTRONIC DEVICE FOR A RADIOFREQUENCY SIGNAL RECEPTION CHAIN, COMPRISING A LOW-NOISE TRANSIMPEDANCE AMPLIFIER STAGE

CROSS REFERENCE TO RELATED APPLICATION

This application is a continuation of U.S. application for patent Ser. No. 14/734,514 filed Jun. 9, 2015, which claims priority from French Application for Patent No. 1458865 filed Sep. 19, 2014, the disclosures of which are incorporated by reference.

TECHNICAL FIELD

Embodiments relate to the reception and processing of radiofrequency signals, in particular RADAR frequency signals, using a frequency transposition stage associated with a transimpedance amplifier (TIA) stage. The embodiments apply in particular, but without limitation, to the processing of motor-vehicle RADAR signals having, for example, a frequency of 77 GHz.

SUMMARY

One embodiment provides a device for significantly improving the dynamic performance of the frequency transposition stage during reception by limiting the voltage swing, in order to work in current mode so as to not degrade the performance.

One embodiment provides, within this device, a transimpedance amplifier stage having low consumption, with an acceptable gain, low noise and a substantially rail-to rail differential voltage swing, that is to say one whose peak-to-peak voltage amplitude is close to the value of the supply voltage.

One embodiment thus provides a device comprising a differential circuit architecture having a frequency transposition stage with current output, with which a transimpedance amplifier stage having a low level of noise as well as a high gain, and having low consumption, is associated.

One aspect provides an electronic device, comprising an input for receiving signals having a first frequency, for example a radiofrequency frequency such as a RADAR frequency, and a differential architecture circuit comprising: at least one frequency transposition stage with current output, coupled to the input, a transimpedance amplifier stage having an amplifier end stage of the class AB type, a preamplifier stage coupled between the output of the frequency transposition stage and the input of the amplifier end stage and comprising first bipolar transistors as well as an active load, and a self-biased common-mode control stage configured in order to bias the preamplifier stage.

The amplifier end stage of the class AB type makes it possible to have low consumption. This type of circuit, however, has a low gain. A preamplifier stage is therefore added at the input of the end stage in order to have a higher gain.

Furthermore, a frequency transposition stage with current output (instead of a voltage output), for example a Gilbert cell, without such a structure implying limitation, makes it possible to have a good dynamic range.

According to one embodiment, the active load of the preamplifier stage comprises first PMOS transistors, and the output of the common-mode control stage is connected to the gates of the first PMOS transistors.

The use of a PMOS transistor in combination with a differential pair of bipolar transistors makes it possible to obtain low noise with a high gain, as well as good robustness in terms of temperature and in relation to fabrication method variations.

According to one embodiment, the amplifier end stage comprises a module, for example a resistive module, connected between the two outputs of this end stage and having a node, and the common-mode control stage comprises a differential pair of second bipolar transistors, the base of one of the second bipolar transistors being intended to receive a common-mode voltage, and the base of the other second bipolar transistor being connected to the node of the module, so that the voltage at this node is intended to be equal to half the sum of the voltages present at the two outputs of the end stage.

According to one embodiment, the collectors of the differential pair of second bipolar transistors are connected to two PMOS transistors connected as a current mirror, which allows self-biasing of this control stage.

According to one embodiment, the end stage comprises two class AB amplifiers, the bases of the pair of first bipolar transistors are respectively connected to the two current outputs of the frequency transposition stage and the two collectors of the pair of first bipolar transistors are respectively connected to the two inputs of the two class AB amplifiers.

According to one embodiment, the frequency transposition stage is configured in order to carry out direct baseband transposition of the input signal.

According to one embodiment, the first frequency of the input signal is a frequency of a RADAR signal.

BRIEF DESCRIPTION OF THE DRAWINGS

Other advantages and characteristics of the invention will become apparent on studying the detailed description of entirely non-limiting embodiments and the appended drawings, in which.

DETAILED DESCRIPTION

Figure 1:
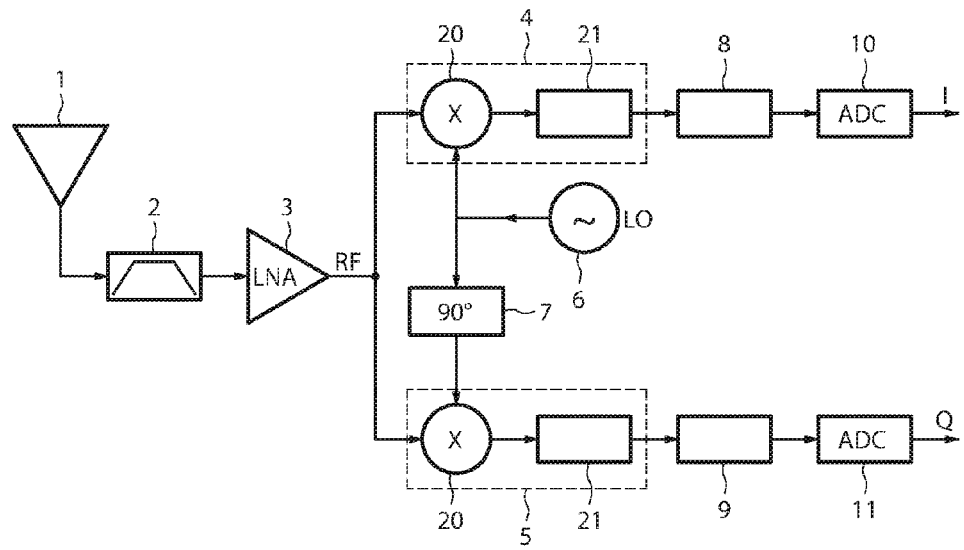
FIG. 1 is a schematic representation of a radiofrequency signal reception chain.

FIG. 1 schematically represents a radiofrequency signal reception chain. In this chain, an antenna 1 receives a signal. This signal is prefiltered by a bandpass filter 2 then amplified by a low-noise amplifier 3 (known by those skilled in the art under the acronym LNA). The RF signal obtained in this way is sent to the input of a device 4 and a device 5, each comprising a mixer 20 associated with a transimpedance amplifier 21. The RF signal is respectively mixed with the signal generated by a local oscillator (LO) 6, and with the same signal phase-shifted through 90° by a phase shifter 7, so as to obtain two frequency shifted (transposed) signals in phase quadrature on the two channels I and Q. Although the invention may be applied to any type of reception chain, in particular of the type with a non-zero intermediate frequency, the chain is in this case of the zero intermediate frequency (ZIF) type, the transposed signals being directly in the baseband, that is to say the frequency of which lies around zero. The baseband signals at the output of the devices 4 and 5 are subsequently processed in conventional modules 8 and 9 having in particular equalization, amplification and lowpass and highpass filtering stages, then are sent to the input of analog/digital converters (ADC) 10 and 11.

The differential architecture of the device 4 will now be described in more detail with reference to FIGS. 2 and 3, it being understood that this architecture is similar to that of the device 5.

Figure 2:
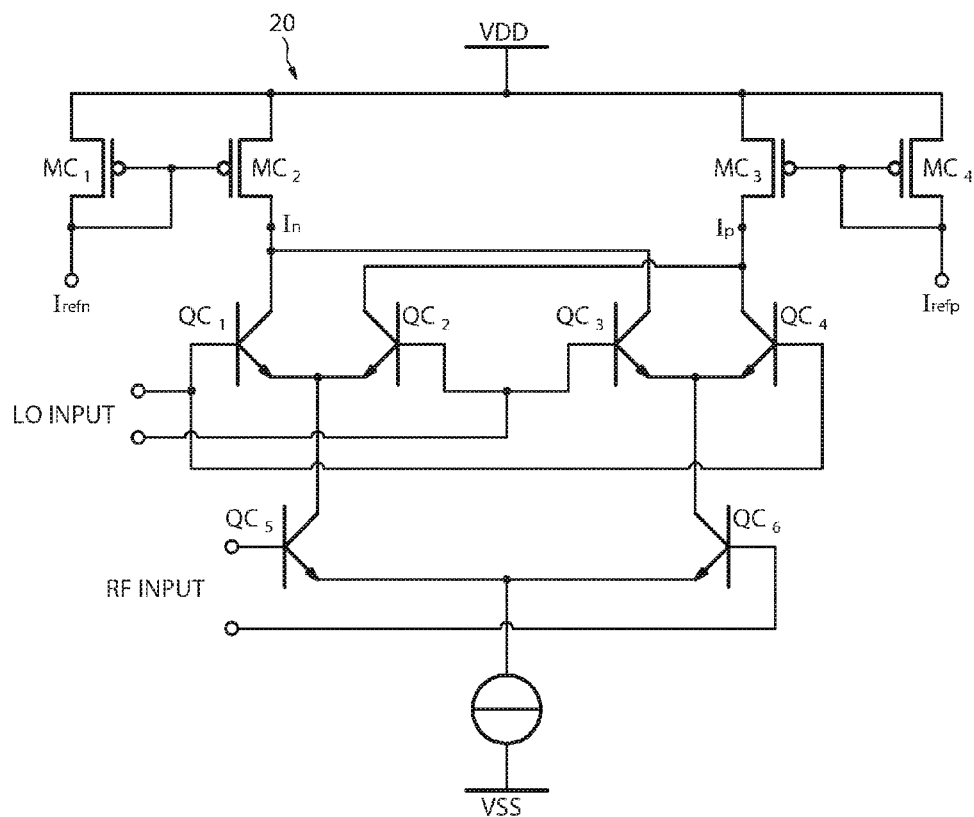
FIG. 2 is a circuit diagram of a frequency transposition stage.

In FIG. 2, reference 20 denotes such a frequency transposition stage with current output.

In the example of FIG. 2, the frequency transposition stage is a Gilbert cell, although the invention is not limited to this type of stage. Thus, it would also be possible to use a current switching device, for example, in particular a mixer with field-effect transistors (FET transistors), for example in the case of production in submicron MOS technology, such as a 28 nm technology on a substrate of the fully depleted silicon on insulator (FDSOI) type, or any type of frequency transposition stage structure with current output.

The Gilbert cell of FIG. 2 comprises three differential pairs of bipolar transistors of the NPN type: $QC_1/QC_2$, $QC_3/QC_4$ and $QC_5/QC_6$, as well as input terminals RF INPUT and LO INPUT on which the radiofrequency signal RF and the signal generated by the local oscillator are respectively received, these terminals being respectively connected to the base electrodes of the transistors $QC_5$ and $QC_6$, and to the base electrodes of the transistors $QC_1$, $QC_2$, $QC_3$ and $QC_4$.

The collector of the transistor $QC_1$ is connected to the collector of the transistor $QC_3$, to the current output terminal In, as well as to the drain of a PMOS transistor $MC_2$ connected as a current mirror with a PMOS transistor $MC_1$, the drain of which is connected to an input terminal Irefn for the reference current.

Symmetrically, the collector of the transistor $QC_4$ is connected to the collector of the transistor $QC_2$, to the current output terminal Ip, and to the drain of a PMOS transistor $MC_3$ connected as a current mirror with a PMOS transistor $MC_4$, the drain of which is connected to an input terminal Irefp for the reference current. The sources of the PMOS transistors are for their part connected to a supply terminal VDD.

The current mirrors formed by the transistors $MC_1$, $MC_2$ and $MC_3$, $MC_4$ make it possible to set the bias current flowing through MC2 and MC3.

The negative current output terminal In and the positive current output terminal Ip are coupled to the input terminals of a transimpedance amplifier stage 21 which will convert the dynamic current at the output of the frequency transposition stage into voltage.

Figure 3:
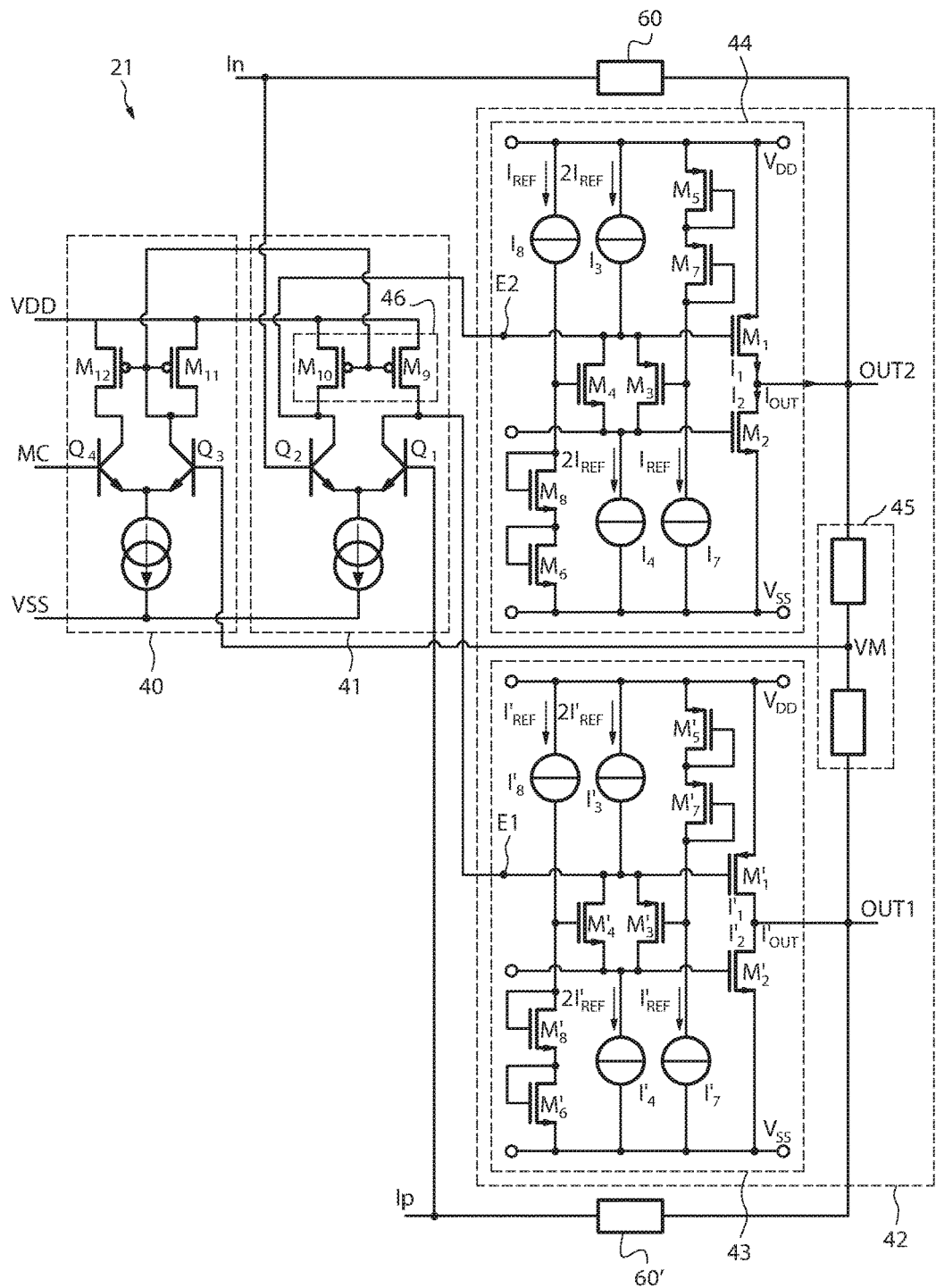
FIG. 3 is a circuit diagram for a transimpedance amplifier.

FIG. 3 illustrates a transimpedance amplifier according to one embodiment.

The transimpedance amplifier 21 comprises an amplifier end stage 42 comprising two class AB amplifiers 43 and 44, as well as a resistive load module 45 connected between the outputs OUT1 and OUT2 of these amplifiers and having a node VM.

Two feedback resistors 60 and 60' are respectively connected between the outputs OUT2, OUT1 and the negative In and positive Ip current output terminals.

The amplifiers 43 and 44 comprise a plurality of MOS transistors, and their output is a rail-to-rail output, that is to say the output voltage of these amplifiers can reach values close to the supply values.

The amplifier 44, with a structure similar to that of the amplifier 43, will now be described in more detail. The references of the elements of the amplifier 43 are suffixed by a "prime" designation (for example, $I'_{OUT}$) relative to the references of the identical elements of the amplifier 44 (for example, $I_{OUT}$).

The AB amplifier per se comprises the MOS transistors $M_1$ and $M_2$ in PUSH-PULL configuration.

It will be recalled here that an amplifier of the class AB type is a compromise between class A and class B. The neutral point of the class AB amplifier lies between that of a class A amplifier and that of a class B amplifier.

The transistors $M_3$, $M_4$ and the current sources $I_3$ and $I_4$ form a biasing stage of the amplifier $M_1$, $M_2$.

The transistors $M_5$, $M_7$ and the current source $I_7$, as well as the transistors $M_6$, $M_8$ and the current source $I_8$, make it possible to bias the biasing stage.

The voltage swing at the output OUT2 varies between two values lying at a few tens of millivolts from each supply rail, for example but without limitation from 0.25 V to 2.25 V for a supply voltage VDD of 2.5 volts.

The voltage VSS is ground.

The gates of the transistors $M_1$ and $M'_1$ form the inputs E2 and E1 of this end stage 42.

The advantage of class AB amplifiers is that they have low consumption. However, the gain of such amplifiers is low.

In order to have a higher gain, a preamplifier stage 41 is coupled between the output In, Ip of the frequency transposition stage 20 and the input E1, E2 of the amplifier end stage 42.

The preamplifier stage 41 comprises a differential pair of bipolar transistors $Q_1$ and $Q_2$, the bases of which are respectively connected to the current outputs Ip and In of the frequency transposition stage, and the collectors of which are respectively connected to the inputs of the amplifiers 43 and 44.

The use of bipolar transistors makes it possible to have a low noise level.

The voltage preamplifier stage 41 furthermore comprises an active load 46 connected to the collectors of the bipolar transistors $Q_1$ and $Q_2$, and in this case comprising two PMOS transistors $M_9$ and $M_{10}$ in order to increase the gain.

The gates of these PMOS transistors are connected via their gates (node VG) to the output of a self-biased common-mode control stage 40 configured in order to bias the preamplifier stage 41.

This common-mode control stage 40 itself also comprises a differential pair of bipolar transistors $Q_3$ and $Q_4$.

The base of the transistor $Q_4$ is connected to a terminal MC which receives a common-mode voltage, that is to say a voltage equal to the average of the supply voltages, here equal to VDD and VSS. In this example, this common-mode voltage is equal to 1.25 V.

The base of the transistor $Q_3$ is for its part connected to the node VM of the module 45 of the amplifier end stage. A common-mode control loop is thus produced, so that the voltage at the node VM is equal to the average of the voltages present at the output terminals OUT1 and OUT2 of the end stage. The two output voltages thus oscillate in phase opposition around the common-mode voltage VDD/2.

Lastly, the collectors of the bipolar transistors $Q_3$ and $Q_4$ are connected to the drains of the two PMOS transistors $M_{11}$ and $M_{12}$, which are connected as a current mirror (so as to self-bias this stage 40) and the gates of which are connected via the node VG to those of the PMOS transistors $M_9$ and $M_{10}$ forming the active load 46 of the preamplifier stage 41.

A transimpedance amplifier having a low noise level and a high gain, and having low consumption as well as a rail-to-rail output, is thus obtained.

Finally, a mixer with improved performance in terms of dynamic range is therefore obtained.

Thus, by way of example, for an RF signal with a RADAR frequency equal to 77 GHz, with the aid of 143 ohm feedback resistors a gain of 43 dBΩ is obtained, which for a dynamic current of 7 mA coming from the frequency transposition stage gives a voltage swing of 2 volts peak-to-peak for a supply of 2.5 volts, a dynamic consumption of the order of 8 mA and an idle consumption of 3 mA, and a noise of less than 17 nV/√Hz.

The invention is not limited to the embodiments which have just been described; rather, it encompasses all variants.

Thus, although the reception chain described above has an architecture of the ZIF type, as indicated above it is possible to have a chain with a plurality of frequency transposition stages, so as to carry out successive transpositions with intermediate frequencies in order to arrive in the baseband, and a transimpedance amplifier stage such as the stage 21 after each frequency transposition stage.

The invention claimed is:

1. A transimpedance amplifier circuit, comprising
an amplifier end stage,
a preamplifier stage coupled between a transimpedance amplifier input and an input of the amplifier end stage, said preamplifier stage comprising:
first bipolar transistors; and
an active load; and
a self-biased common-mode control stage configured to bias the preamplifier stage.

2. The transimpedance amplifier circuit of claim 1, wherein the active load of the preamplifier stage comprises:
a pair of load transistors, and
wherein an output of the self-biased common-mode control stage is connected to control terminals of the pair of load transistors.

3. The transimpedance amplifier circuit of claim 1, wherein the amplifier end stage comprises a circuit module connected between two outputs of the amplifier end stage and having a node, and wherein the self-biased common-mode control stage comprises a differential pair of bipolar transistors, wherein a base of one of the bipolar transistors is configured to receive a common-mode voltage, and wherein a base of another of the bipolar transistors is connected to said node of the circuit module.

4. The transimpedance amplifier circuit of claim 3, wherein collectors of the differential pair of bipolar transistors are connected to a pair of load transistors connected as a current mirror.

5. The transimpedance amplifier circuit of claim 1, wherein the preamplifier stage comprises a differential pair of bipolar transistors, wherein bases of the bipolar transistors are configured to differential signals of the transimpedance amplifier input.

6. The transimpedance amplifier circuit of claim 1, further comprising a feedback resistor coupled between an output of the amplifier end stage and the transimpedance amplifier input.

7. The transimpedance amplifier circuit of claim 1, wherein the amplifier end stage comprises:
a first amplifier having an input coupled to a first output of the preamplifier stage and having a first output;
a second amplifier having an input coupled to a second output of the preamplifier stage and having a second output; and
a circuit module connected between the first and second outputs.

8. The transimpedance amplifier circuit of claim 7, wherein the circuit module has an intermediate node between the first and second outputs, and wherein a first input of the self-biased common-mode control stage is coupled to the intermediate node and a second input of the self-biased common-mode control stage is coupled to receive a common mode reference voltage.

9. The transimpedance amplifier circuit of claim 7, wherein the first output of the preamplifier stage is at a first interconnection node between the first bipolar transistors and the active load and wherein the second output of the preamplifier stage is at a second interconnection node between the first bipolar transistors and the active load.

10. A transimpedance amplifier circuit, comprising:
a first amplifier end stage having a first input;
a second amplifier end stage having a second input;
a resistive divider circuit coupled between a first output of the first amplifier end stage and a second output of the second amplifier end stage, the resistive divider circuit having an intermediate node between the first and second outputs; and
a common-mode control circuit comprising a differential amplifier having a first input configured to receive a common-mode voltage and a second input coupled to the intermediate node of the resistive divider circuit, wherein the differential amplifier includes an output coupled to control biasing of the first and second amplifier end stages.

11. The transimpedance amplifier circuit of claim 10, further comprising a preamplifier stage having differential signal inputs and differential signal outputs, wherein the differential signal outputs are coupled, respectively, to the first and second inputs of the first and second amplifier end stages.

12. The transimpedance amplifier circuit of claim 10, wherein the preamplifier stage comprises:
a differential amplifier circuit;
an active load circuit coupled to the differential amplifier circuit and wherein a control terminal of the active load is coupled to receive a bias control signal output by the common-mode control circuit.

13. A transimpedance amplifier circuit, comprising:
an amplifier end stage having an input and output, and
a preamplifier stage coupled between an amplifier input and the input of the amplifier end stage and comprising first bipolar transistors as well as an active load, and a self-biased common-mode control stage configured to bias the preamplifier stage.

14. The transimpedance amplifier circuit of claim 13, wherein the active load of the preamplifier stage comprises first PMOS transistors and an output of the self-biased common-mode control stage is connected to control terminals of the first PMOS transistors.

15. The transimpedance amplifier circuit of claim 13, wherein the amplifier end stage comprises a circuit module connected between two outputs of the amplifier end stage and having a node, and the self-biased common-mode control stage comprises a differential pair of second bipolar transistors, a base of one of the second bipolar transistors configured to receive a common-mode voltage, and a base of the other second bipolar transistor being connected to said node of the circuit module so that a voltage at said node is controller to be equal to half a sum of the voltages present at the two outputs of the amplifier end stage.

16. The transimpedance amplifier circuit of claim 15, wherein collectors of the differential pair of second bipolar transistors are connected to two PMOS transistors connected as a current mirror.

17. The transimpedance amplifier circuit of claim 13, wherein the amplifier end stage comprises two class AB amplifiers, wherein control terminals of the first bipolar transistors are respectively connected to the amplifier input and collectors of the first bipolar transistors are respectively connected to inputs of the two class AB amplifiers.

18. A transimpedance amplifier circuit, comprising:
- a first amplifier end stage having an input coupled to a first amplifier input;
- a second amplifier end stage having an input coupled to a second amplifier input;
- a resistive divider circuit coupled between a first output of the first amplifier end stage and a second output of the second amplifier end stage, the resistive divided circuit having an output node;
- a common-mode control circuit comprising a differential amplifier having a first input configured to receive a common-mode voltage and a second input coupled to the output node of the resistive divider circuit, the differential amplifier having an output coupled to control biasing of the first and second amplifier end stages.

19. The transimpedance amplifier circuit of claim 18, further comprising a preamplifier stage coupled between the first and second current outputs of the frequency transposition stage and the inputs of the first and second amplifier end stages.

20. The transimpedance amplifier circuit of claim 19, wherein the preamplifier stage comprises a differential amplifier circuit with an active load circuit coupled to receive a bias control signal output by the common-mode control circuit.

* * * * *